(12) United States Patent
Otsubo et al.

(10) Patent No.: US 12,177,976 B2
(45) Date of Patent: Dec. 24, 2024

(54) MODULE

(71) Applicant: Murata Manufacturing Co., Ltd., Nagaokakyo (JP)

(72) Inventors: Yoshihito Otsubo, Nagaokakyo (JP); Takahiro Kitazume, Nagaokakyo (JP); Takanori Uejima, Nagaokakyo (JP)

(73) Assignee: MURATA MANUFACTURING CO., LTD., Kyoto-fu (JP)

( * ) Notice: Subject to any disclaimer, the term of this patent is extended or adjusted under 35 U.S.C. 154(b) by 234 days.

(21) Appl. No.: 17/649,434

(22) Filed: Jan. 31, 2022

(65) Prior Publication Data

US 2022/0159834 A1   May 19, 2022

Related U.S. Application Data

(63) Continuation of application No. PCT/JP2020/028653, filed on Jul. 27, 2020.

(30) Foreign Application Priority Data

Aug. 1, 2019 (JP) .................................. 2019-142316
Jul. 16, 2020 (JP) .................................. 2020-122277

(51) Int. Cl.
  *H05K 1/18*   (2006.01)
  *H05K 1/11*   (2006.01)
(52) U.S. Cl.
  CPC ............ *H05K 1/115* (2013.01); *H05K 1/185* (2013.01)
(58) Field of Classification Search
  CPC .............................. H05K 1/115; H05K 1/185

USPC ......................................................... 361/736
See application file for complete search history.

(56) References Cited

U.S. PATENT DOCUMENTS

| | | | |
|---|---|---|---|
| 9,066,422 B2* | 6/2015 | Shimada | H01L 23/49827 |
| 2007/0114644 A1* | 5/2007 | Miller | H01L 23/49838 |
| | | | 257/E23.07 |
| 2014/0293550 A1 | 10/2014 | Mugiya et al. | |
| 2017/0263568 A1 | 9/2017 | Joen et al. | |
| 2018/0159217 A1 | 6/2018 | Mikata et al. | |
| 2019/0393166 A1 | 12/2019 | Otsubo | |

FOREIGN PATENT DOCUMENTS

| | | |
|---|---|---|
| JP | 2001-44305 A | 2/2001 |
| JP | 2006-041234 A | 2/2006 |
| JP | 2009-212309 A | 9/2009 |

(Continued)

OTHER PUBLICATIONS

International Search Report for International Patent Application No. PCT/JP2020/028653 dated Oct. 20, 2020.

(Continued)

*Primary Examiner* — Hung S. Bui
(74) *Attorney, Agent, or Firm* — Pearne & Gordon LLP

(57) ABSTRACT

A module includes: a board having a first main surface; a first component mounted on the first main surface; a first wire group including a plurality of wires disposed to extend across the first component; a first ground conductor disposed inside the board; and a first conductor via group including a plurality of via conductors that connect each of the wires belonging to the first wire group and the first ground conductor. The first component is surrounded by the first wire group, the first conductor via group, and the first ground conductor.

20 Claims, 13 Drawing Sheets

(56) References Cited

FOREIGN PATENT DOCUMENTS

| JP | 2014-203881 A | 10/2014 |
| JP | 2018-093015 A | 6/2018 |
| WO | 2018/164158 A1 | 9/2018 |

OTHER PUBLICATIONS

Written Opinion for International Patent Application No. PCT/JP2020/028653 dated Oct. 20, 2020.

* cited by examiner

MODULE

CROSS REFERENCE TO RELATED APPLICATION

This is a continuation of International Application No. PCT/JP2020/028653 filed on Jul. 27, 2020 which claims priority from Japanese Patent Application No. 2019-142316 filed on Aug. 1, 2019 and Japanese Patent Application No. 2020-122277 filed on Jul. 16, 2020. The contents of these applications are incorporated herein by reference in their entireties.

BACKGROUND OF THE DISCLOSURE

Field of the Disclosure

The present disclosure relates to a module.

Description of the Related Art

Japanese Patent Laid-Open No. 2014-203881 (PTL 1) discloses a circuit module in which a groove portion is provided in a sealing resin by laser processing and filled with an electrically conductive resin or an electrically conductive paint to thereby form an electrically conductive shield. In this case, a thick portion is provided in a wiring portion provided on a wiring board.

PTL 1: Japanese Patent Laid-Open No. 2014-203881

BRIEF SUMMARY OF THE DISCLOSURE

First, in the configuration disclosed in PTL 1, the groove portion is provided in the sealing resin by laser processing. Thus, embedded components may be damaged during laser processing. Further, the wiring board may also be damaged. In the case of laser processing, scanning with laser light is temporarily stopped at a corner portion where the groove portion is bent. Accordingly, damage to the wiring board tends to increase at this corner portion.

Further, in PTL 1, the thick portion of wires is formed on the wiring board in order to protect the wiring board. This thick portion is formed of a metal component or the like, which therefore sacrifices the area on which components can be mounted on the wiring board. Consequently, size reduction of the module is hindered.

Thus, an object of the present disclosure is to provide a module that can be reduced in size since a shield can be disposed in the vicinity of mounted components without damaging a wiring board.

In order to achieve the above-described object, a module according to the present disclosure includes: a board having a first main surface; a first component mounted on the first main surface; a first wire group including a plurality of wires disposed to extend across the first component; a first ground conductor disposed inside the board; and a first conductor via group including a plurality of via conductors that connect each of the wires belonging to the first wire group and the first ground conductor. The first component is surrounded by the first wire group, the first conductor via group, and the first ground conductor.

The present disclosure can provide a module that can be reduced in size since the shield can be disposed in the vicinity of the mounted components without damaging the wiring board.

DETAILED DESCRIPTION OF THE DISCLOSURE

The dimension ratio shown in each of the figures does not always faithfully show the actual dimension ratio, but may show the dimension ratio in an exaggerated manner for the sake of explanation. In the following description, mentioning the concept "upper" or "lower" does not necessarily indicate an absolute upper or lower position, but may indicate a relatively upper or lower position in the posture shown in each figure.

First Embodiment

A module in the first embodiment according to the present disclosure will be hereinafter described with reference to FIGS. 1 to 4. The module disclosed herein may be a module having components embedded therein or a module having components mounted thereon.

Figure 1:
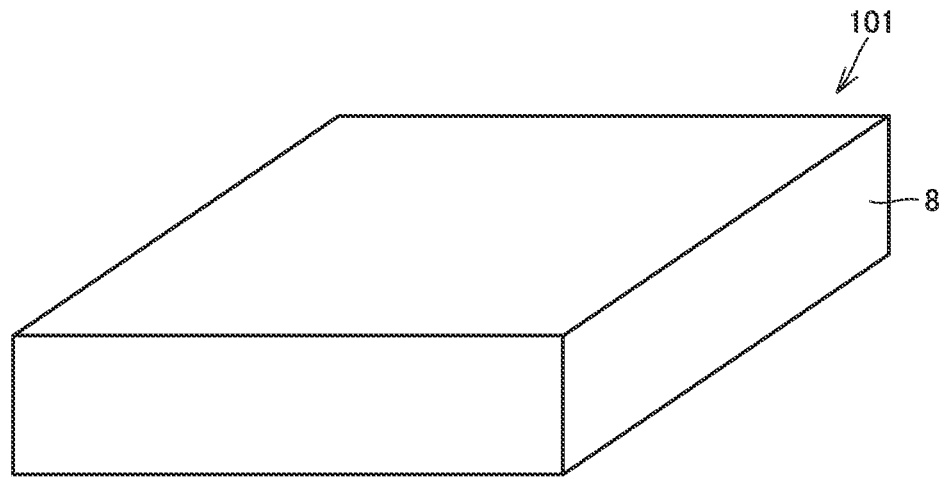
FIG. 1 is a first perspective view of a module in a first embodiment according to the present disclosure.
Figure 2:
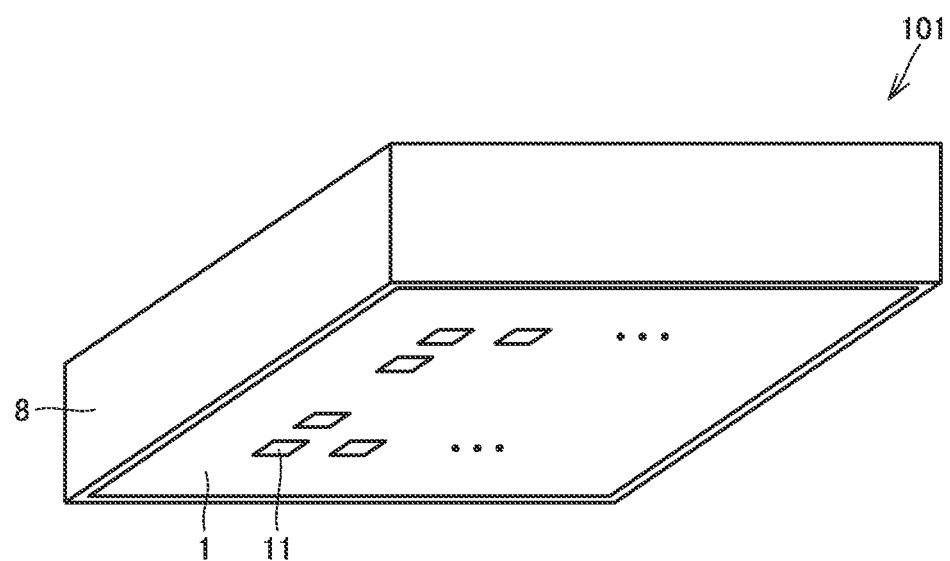
FIG. 2 is a second perspective view of the module in the first embodiment according to the present disclosure.
Figure 3:
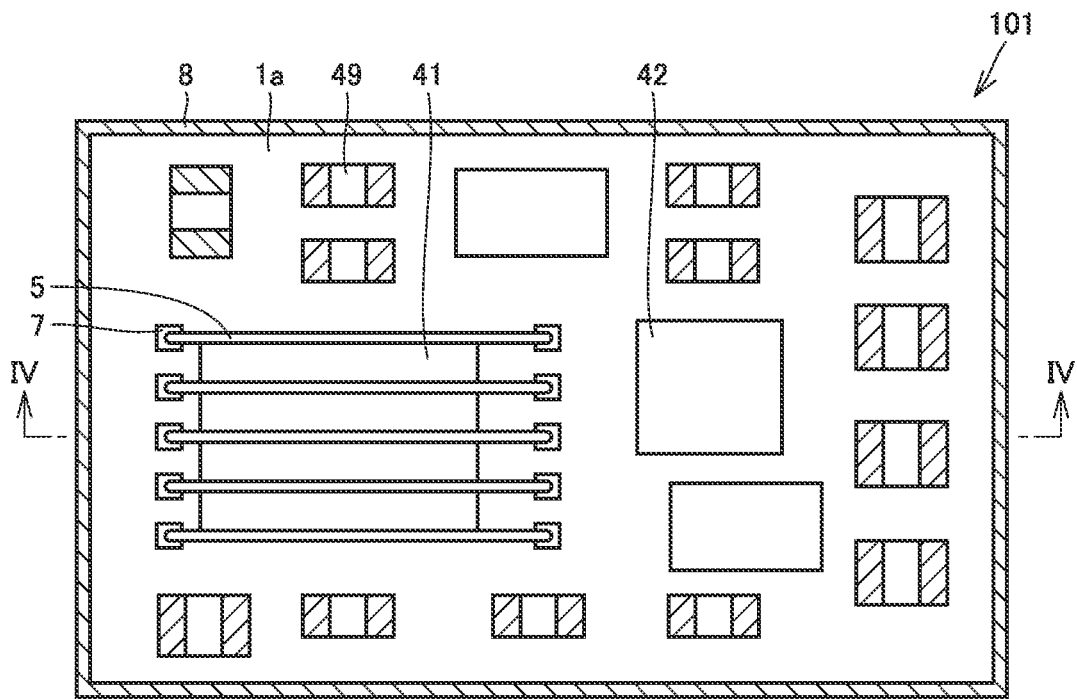
FIG. 3 is a perspective plan view of the module in the first embodiment according to the present disclosure.
Figure 4:
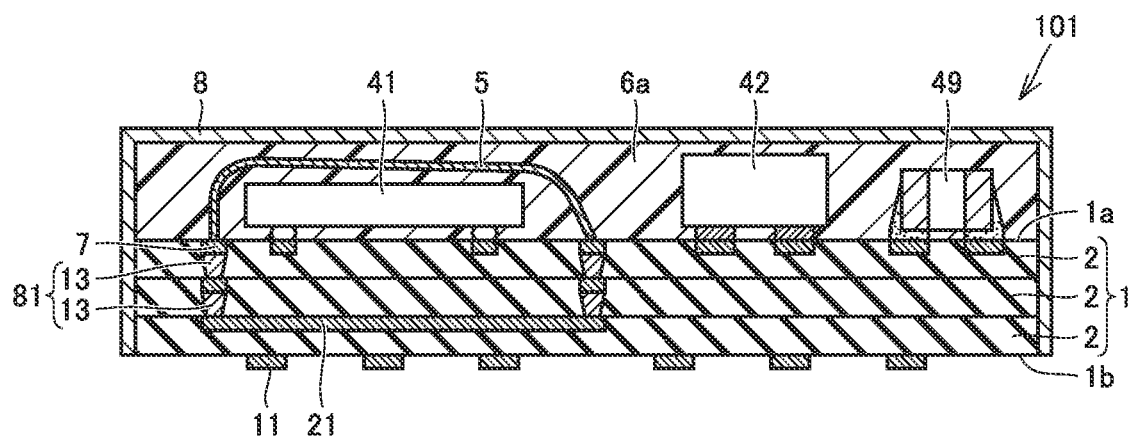
FIG. 4 is a cross-sectional view taken along a line IV-IV in FIG. 3.

FIG. 1 shows an external appearance of a module 101 in the present embodiment. The upper surface and the side surface of module 101 are covered with a shield film 8. FIG. 2 shows module 101 in FIG. 1 viewed obliquely from below. The lower surface of module 101 is not covered with shield film 8, so that a board 1 is exposed. One or more external electrodes 11 are provided on the lower surface of board 1. The number, the size, and the arrangement of external electrodes 11 in FIG. 2 are shown merely by way of example. FIG. 3 shows a perspective plan view of module 101. FIG. 3 is a top plan view of module 101 from which the upper surface of shield film 8 has been removed and a first sealing resin 6a has also been removed. First component 41 is mounted on a first main surface 1a of board 1. First component 41 may be an integrated circuit (IC), for example. More specifically, first component 41 may be a low noise amplifier (LNA), for example. A plurality of pad electrodes 7 are disposed on first main surface 1a. FIG. 4 is a cross-sectional view taken along a line IV-IV in FIG. 3. Board 1 may have wiring mounted thereon or embedded therein. Board 1 may be a resin board or a ceramic board. Board 1 may be a multilayer board.

Module 101 in the present embodiment includes: board 1 having first main surface 1a; first component 41 mounted on first main surface 1a; a first wire group including a plurality of wires 5 disposed to extend across first component 41; a first ground conductor 21 disposed inside board 1; and a first conductor via group 81 including a plurality of via conductors that connect each of wires 5 belonging to the first wire group and first ground conductor 21. First component 41 is surrounded by the first wire group, first conductor via group 81, and first ground conductor 21. In other words, first component 41 is shielded by the first wire group, first conductor via group 81, and first ground conductor 21 that are electrically connected to be contiguous to each other. The plurality of wires 5 each are formed of a conductor. The "conductor" disclosed herein is metal, for example. First ground conductor 21 is grounded via wiring (not shown).

In the example illustrated herein, one set of five wires 5 shown in FIG. 3 is the first wire group, which is however shown merely by way of example. The number of wires 5 belonging to the first wire group is not limited to five and may be any other number. All of wires 5 belonging to the first wire group does not have to have the same length, but some of wires 5 may have different lengths.

As shown in FIG. 4, board 1 may be formed by stacking a plurality of insulating layers 2. Board 1 has first main surface 1a and a second main surface 1b opposite to first main surface 1a. In addition to first component 41, a component 42 and a chip component 49 are also mounted on first main surface 1a of board 1. The shape, the number, the arrangement, and the like of each of component 42, chip component 49 and the like shown in this case are merely by way of example. First component 41, component 42, chip component 29, wire 5, and the like are sealed by first sealing resin 6a. In other words, first component 41 and the first wire group are sealed by first sealing resin 6a. The upper surface and the side surface of first sealing resin 6a and the side surface of board 1 are covered with shield film 8.

In the present embodiment, the module can be reduced in size since the shield can be disposed in the vicinity of the mounted components without damaging the wiring board. In particular, as shown in FIG. 4, the first wire group, first conductor via group 81, and first ground conductor 21 are electrically connected to be contiguous to each other so as to surround first component 41. Thereby, the shield for first component 41 as a mounted component can be reinforced as a compartment shield.

Second Embodiment

Figure 5:
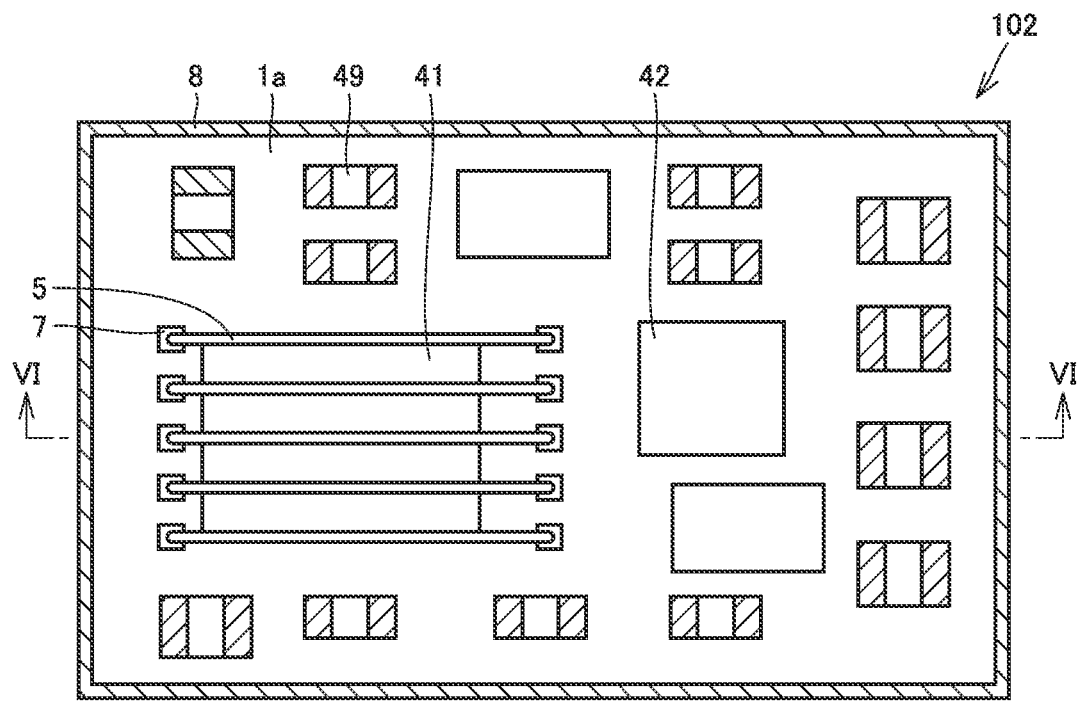
FIG. 5 is a perspective plan view of a module in a second embodiment according to the present disclosure.
Figure 6:
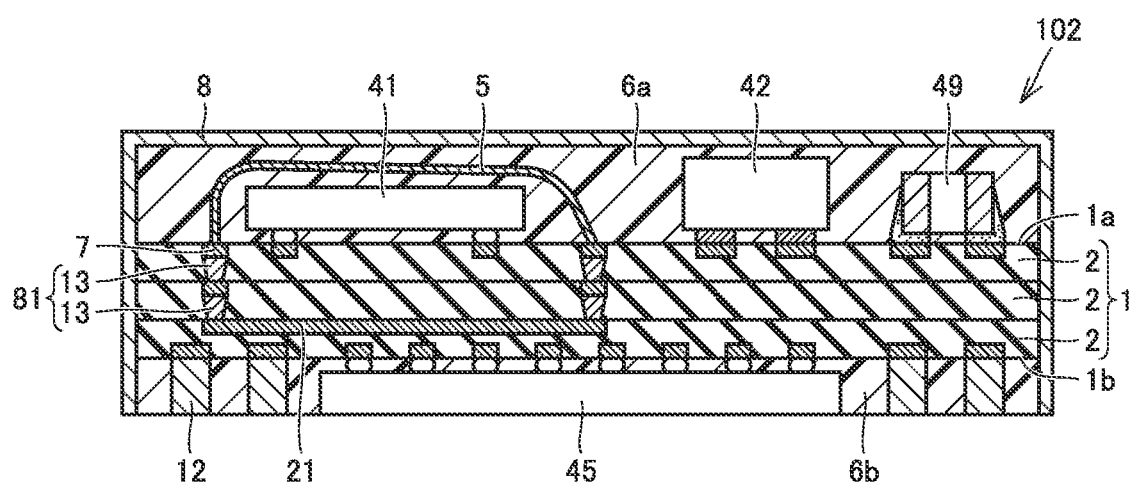
FIG. 6 is a cross-sectional view taken along a line VI-VI in FIG. 5.

A module in the second embodiment according to the present disclosure will be hereinafter described with reference to FIGS. 5 and 6. FIG. 5 is a perspective plan view of a module 102 in the present embodiment. FIG. 5 is a top plan view of module 102 from which the upper surface of a shield film 8 has been removed and a first sealing resin 6a has also been removed. FIG. 6 is a cross-sectional view taken along a line VI-VI in FIG. 5. Board 1 has a second main surface 1b opposite to a first main surface 1a. In module 102, a second component 45 is mounted on second main surface 1b. A second sealing resin 6b is disposed so as to cover second main surface 1b. The lower surface of second component 45 is exposed from second sealing resin 6b. A conductor column 12 is disposed on second main surface 1b. Conductor column 12 is used as an external electrode of module 102. The lower end of conductor column 12 is exposed from second sealing resin 6b. As conductor column 12, a metal pin, a metal block, a protruding electrode, plating, a part of a wire, or the like can be used.

In the present embodiment, second main surface 1b of board 1 is also used as a surface on which components are mounted, so that more components can be mounted in a limited area.

Third Embodiment

Figure 7:
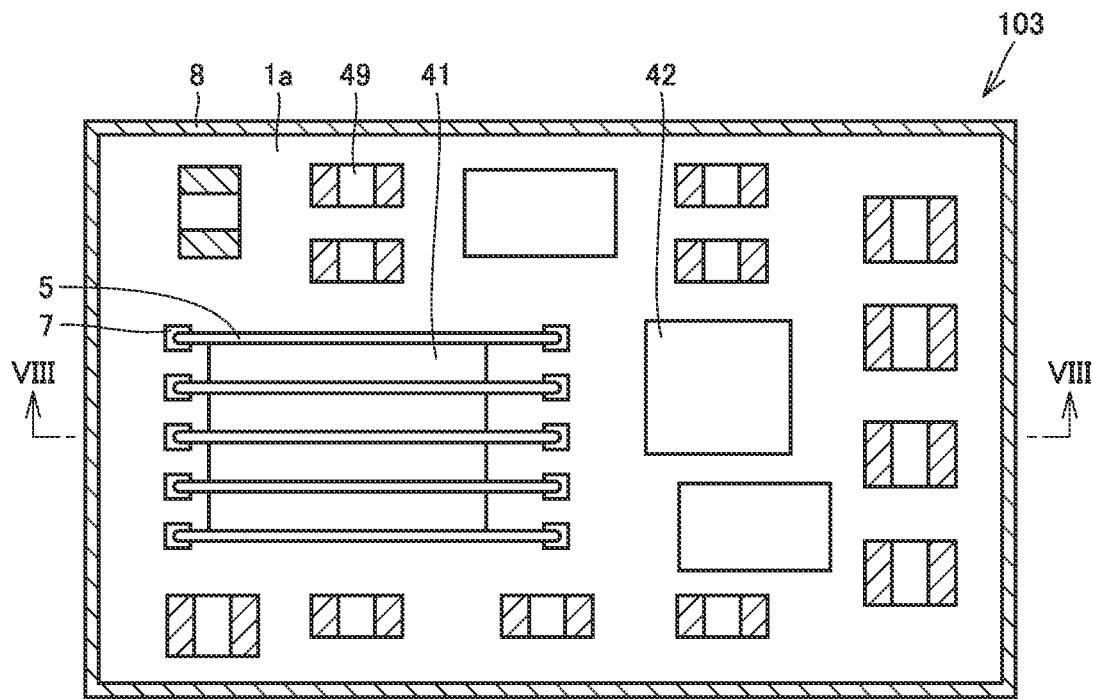
FIG. 7 is a perspective plan view of a module in a third embodiment according to the present disclosure.
Figure 8:
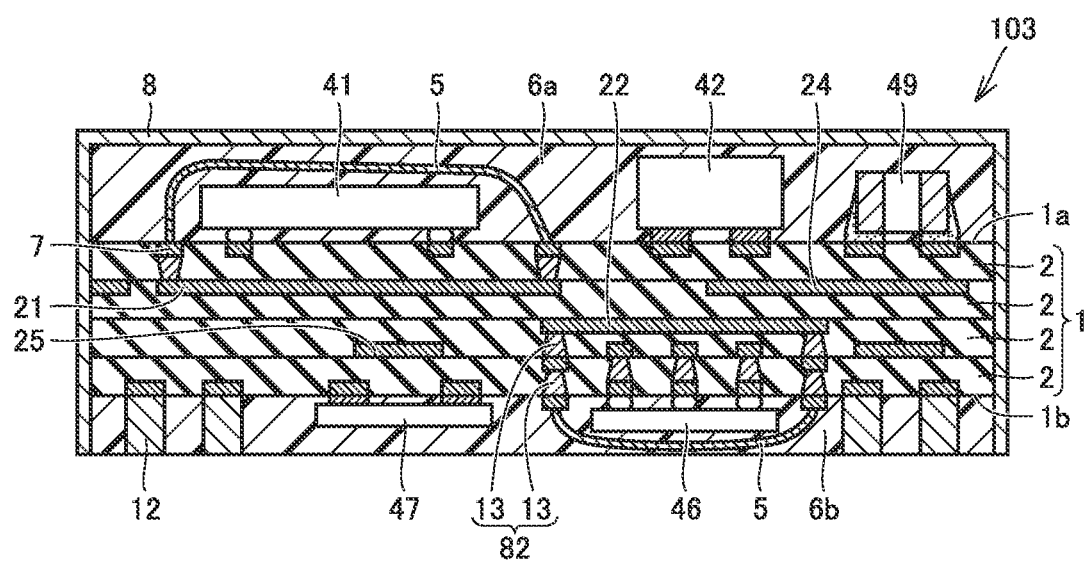
FIG. 8 is a cross-sectional view taken along a line VIII-VIII in FIG. 7.

A module in the third embodiment according to the present disclosure will be hereinafter described with reference to FIGS. 7 and 8. FIG. 7 is a perspective plan view of a module 103 in the present embodiment. FIG. 8 is a cross-sectional view taken along a line VIII-VIII in FIG. 7.

In module 103, in addition to first ground conductor 21, a ground conductor 24 is also disposed inside board 1. First ground conductor 21 is independent of another ground conductor 24 disposed inside board 1. In addition to ground conductor 24, a second ground conductor 22 and a conductor 25 are also disposed inside board 1.

A second component 46 and a component 47 are mounted on second main surface 1b. A plurality of wires 5 are disposed as a second wire group so as to extend across second component 46. Module 103 includes a second conductor via group 82 that connects the end of each of wires 5 belonging to the second wire group and second ground conductor 22. Second conductor via group 82 includes a plurality of conductor vias 13. Ground conductor 24 is grounded through an external electrode different from that of first ground conductor 21.

In the present embodiment, since first ground conductor 21 is electrically independent of another ground conductor 24 disposed inside board 1, undesired electromagnetic waves having been transmitted to board 1 can be prevented from being transmitted to other conductors.

Module 103 includes: a second wire group including a plurality of wires 5 disposed to extend across second component 46; a second ground conductor 22 disposed inside board 1; and a second conductor via group 82 including a plurality of via conductors that connect each of wires 5 belonging to the second wire group and second ground conductor 22. Second component 46 is surrounded by the second wire group, second conductor via group 82, and second ground conductor 22. A second sealing resin 6b is disposed so as to cover second main surface 1b. Each of wires 5 belonging to the second wire group extending across second component 46 is covered with second sealing resin 6b. In other words, the second wire group, second conductor via group 82, and second ground conductor 22 are electrically connected to be contiguous to each other so as to surround second component 46, and thereby, the shield for second component 46 as a mounted component can be reinforced as a compartment shield.

Fourth Embodiment

Figure 9:
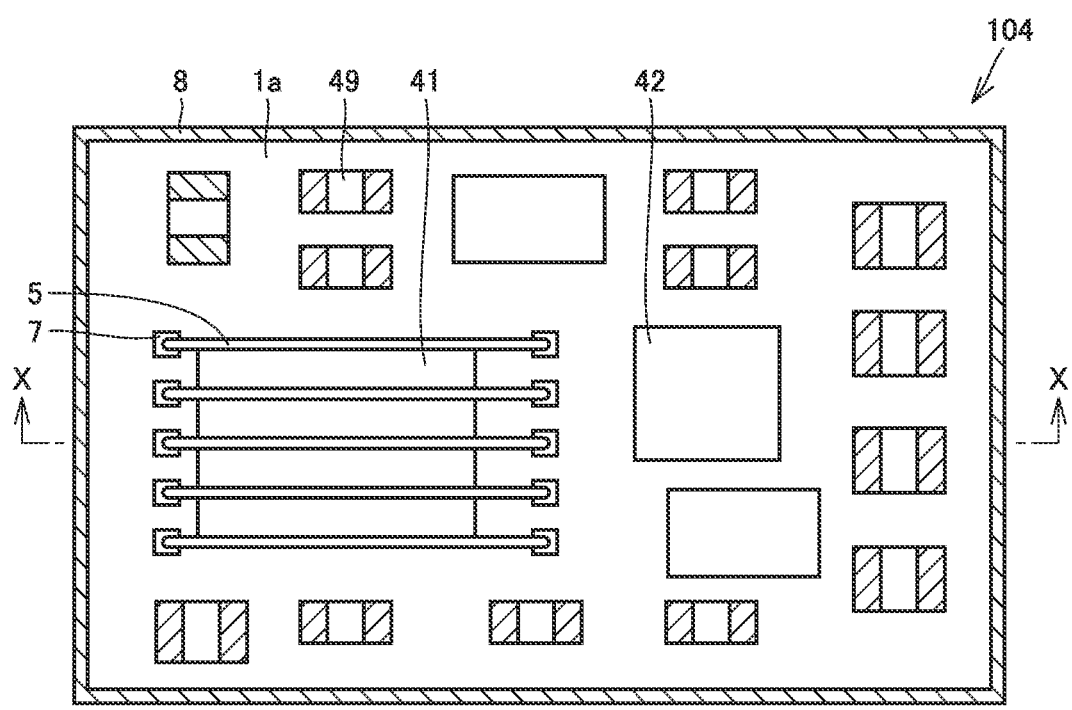
FIG. 9 is a perspective plan view of a module in a fourth embodiment according to the present disclosure.
Figure 10:
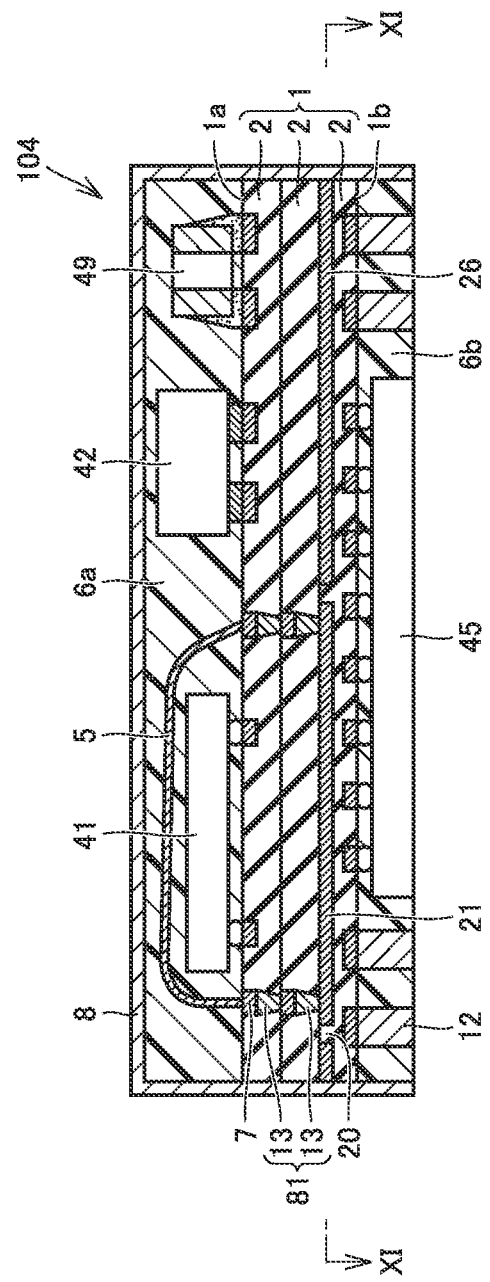
FIG. 10 is a cross-sectional view taken along a line X-X in FIG. 9.
Figure 11:
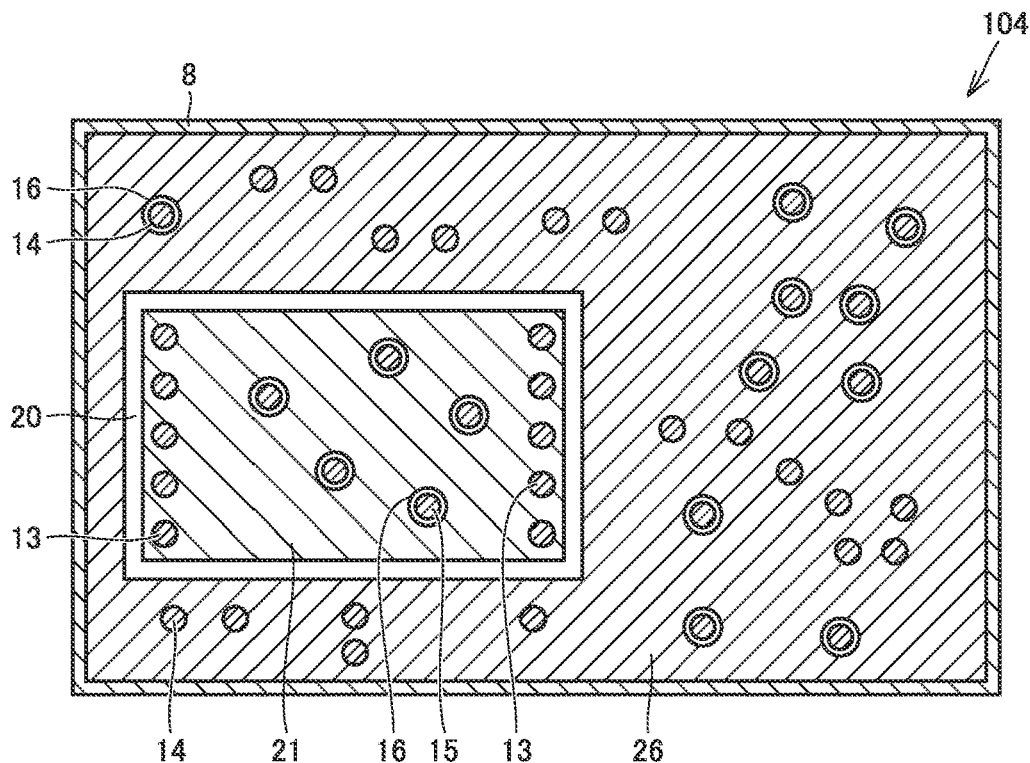
FIG. 11 is a cross-sectional view taken along a line XI-XI in FIG. 10.

A module in the fourth embodiment according to the present disclosure will be hereinafter described with reference to FIGS. 9 to 11. FIG. 9 is a perspective plan view of a module 104 in the present embodiment. FIG. 10 is a cross-sectional view taken along a line X-X in FIG. 9. FIG. 11 is a cross-sectional view taken along a line XI-XI in FIG. 10.

In module 104, in addition to first ground conductor 21, a ground conductor 26 is also disposed on the same layer inside board 1. First ground conductor 21 and ground conductor 26 are located close to each other with a gap 20 interposed therebetween. As shown in FIG. 11, ground conductor 26 surrounds first ground conductor 21. A plurality of conductor vias 13 belonging to first conductor via group 81 are connected to first ground conductor 21. As shown in FIG. 11, first ground conductor 21 is provided with a number of openings 16, and conductor vias 15 are provided to pass through their respective openings 16. Each conductor via 15 is, for example, a signal line connected to first component 41. As disclosed herein, a signal line is generally connected to first component 41 as a shield target. This signal line preferably passes through the opening of first ground conductor 21. Ground conductor 26 is also provided with a number of openings 16, and conductor vias 14 are provided to pass through their respective openings 16. Through each of openings 16, a signal line of a component other than first component 41 as a shield target preferably passes.

In the present embodiment, first ground conductor 21 and ground conductor 26 are separately disposed. This can prevent a phenomenon in which noise flows through the ground conductor and enters the first component as a shield target. In other words, deterioration of the shield characteristics can be suppressed.

Fifth Embodiment

Figure 12:
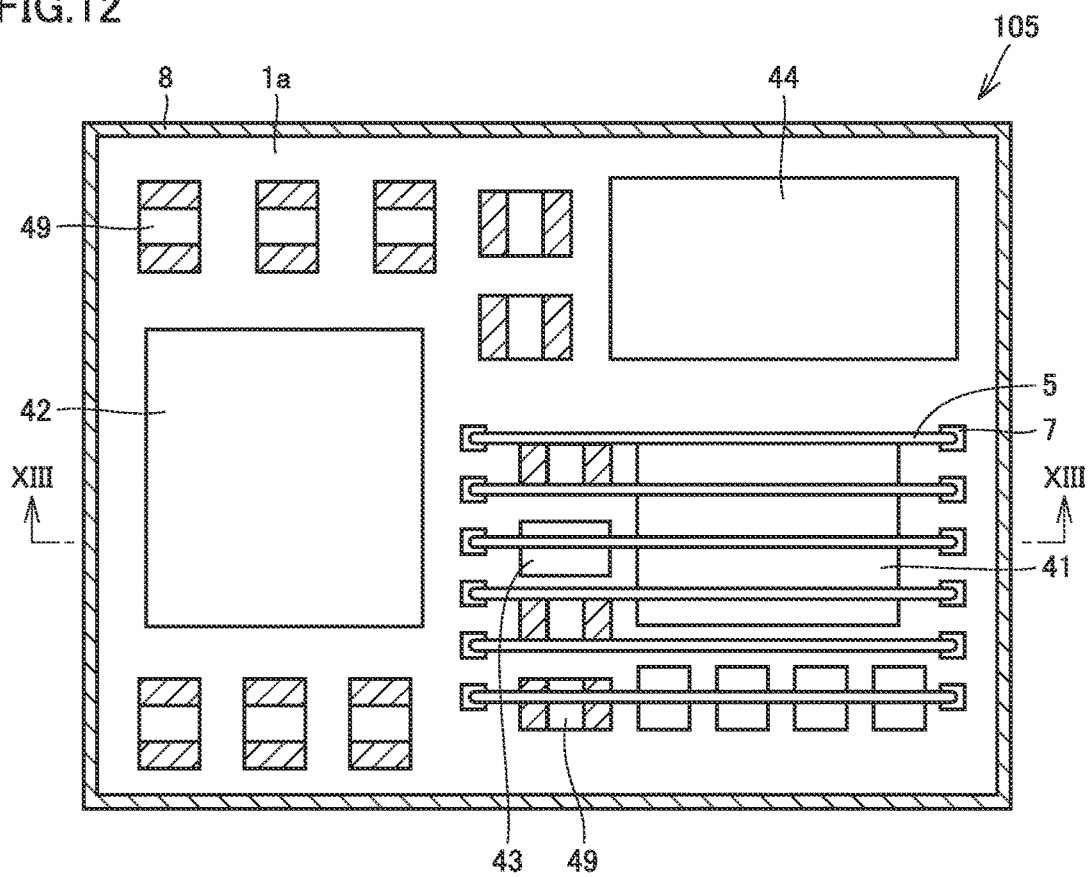
FIG. 12 is a perspective plan view of a module in a fifth embodiment according to the present disclosure.
Figure 13:
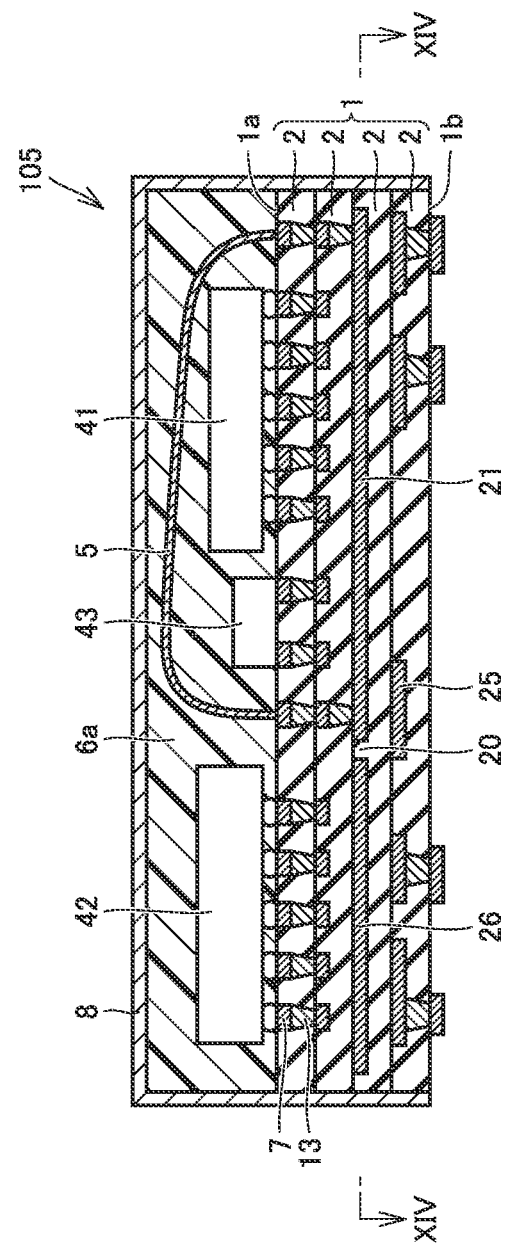
FIG. 13 is a cross-sectional view taken along a line XIII-XIII in FIG. 12.

A module in the fifth embodiment according to the present disclosure will be hereinafter described with reference to FIGS. 12 and 13. FIG. 12 is a perspective plan view of a module 105 in the present embodiment. FIG. 13 is a cross-sectional view taken along a line XIII-XIII in FIG. 12.

In module 105, a plurality of wires 5 as the first wire group extend across not only first component 41 but also components 43 and 49. First ground conductor 21 is disposed so as to cover a large area including not only first component 41 but also component 43 and the like in a collective manner.

Also, in the present embodiment, the shielding performance can be enhanced. As illustrated in the present embodiment, a group of wires 5 may extend across a plurality of components, for which compartment shielding is required, in a collective manner. This allows compartment shielding for a plurality of components in a collective manner.

Sixth Embodiment

Figure 14:
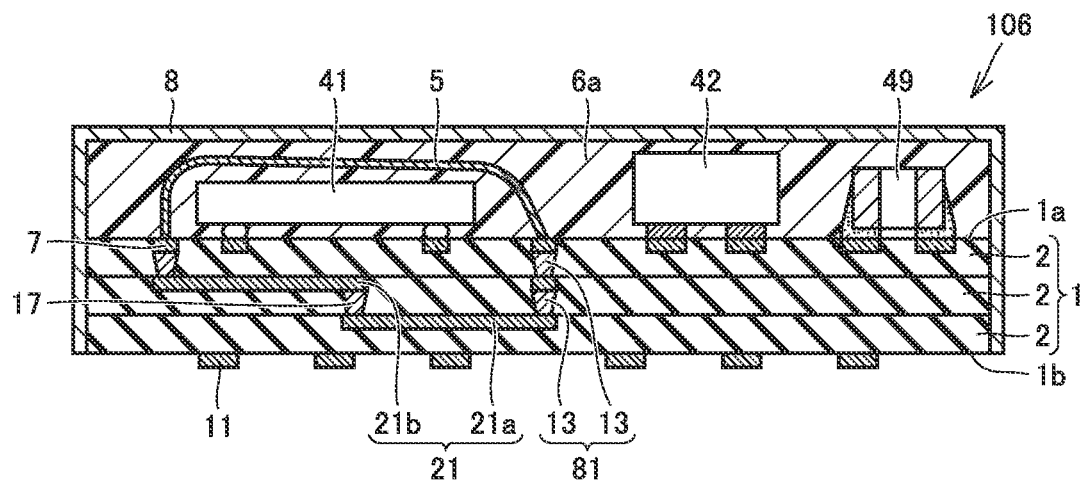
FIG. 14 is a cross-sectional view of a module in a sixth embodiment according to the present disclosure.

A module in the sixth embodiment according to the present disclosure will be hereinafter described with reference to FIG. 14. In a module 106, a first ground conductor 21 is formed of a combination of a plurality of conductors. First ground conductor 21 includes a conductor 21a and a conductor 21b. Conductors 21a and 21b are disposed at different heights inside board 1. Conductors 21a and 21b are electrically connected through a conductor via 17. Other configurations are the same as those of module 101 described in the first embodiment.

Also, in the present embodiment, the same effect as that in the first embodiment can be achieved. In the example shown in this case, first ground conductor 21 is configured of a combination of two conductors disposed at different heights, which is however shown merely by way of example. First ground conductor 21 may be a combination of three or more conductors.

Seventh Embodiment

Figure 15:
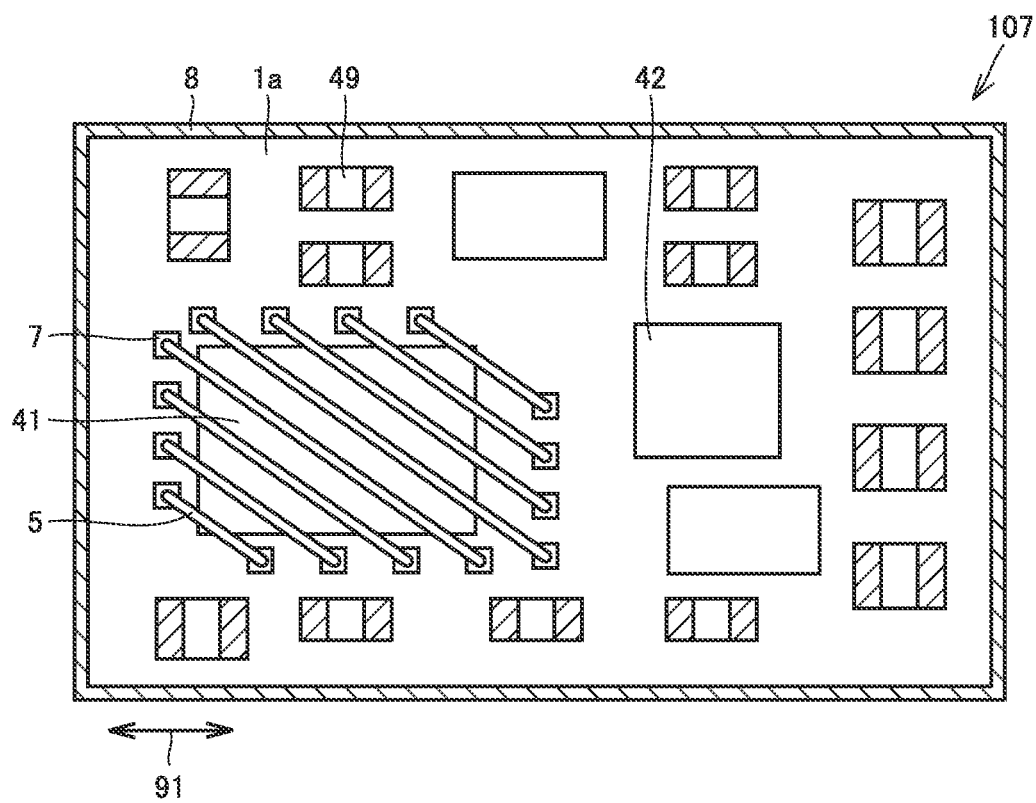
FIG. 15 is a perspective plan view of a module in a seventh embodiment according to the present disclosure.

A module in the seventh embodiment according to the present disclosure will be hereinafter described with reference to FIG. 15. A module 107 includes a first wire group including a plurality of wires 5 disposed to extend across first component 41. In a plan view of module 107, the first wire group is disposed obliquely with respect to first component 41. The phrase "obliquely with respect to first component 41" means "obliquely with respect to each side of first component 41". In the example shown in this case, the first wire group is disposed obliquely with respect to a longitudinal direction 91 of first component 41. Other configurations are the same as those of module 101 described in the first embodiment.

In the present embodiment, since wires 5 belonging to the first wire group are disposed obliquely with respect to first component 41, the end of each wire 5 can be readily disposed to extend along the corresponding side of first component 41. As shown in FIG. 15, ends of wires 5 can also be disposed to surround all sides of first component 41. This allows more reliable shielding.

Eighth Embodiment

Figure 16:
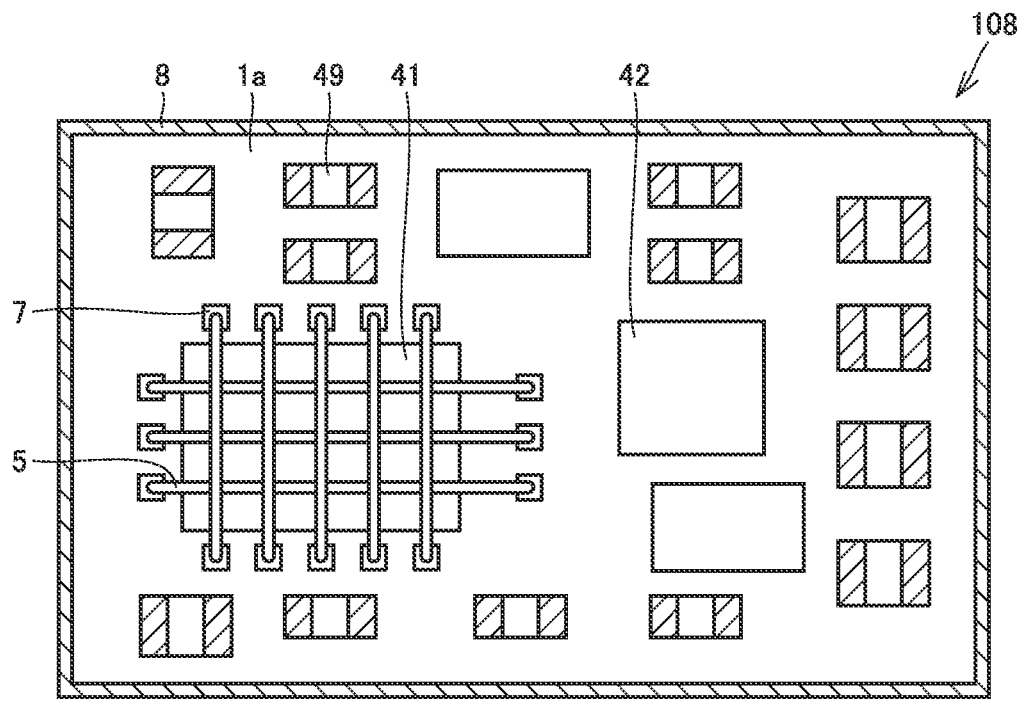
FIG. 16 is a perspective plan view of a module in an eighth embodiment according to the present disclosure.

A module in the eighth embodiment according to the present disclosure will be hereinafter described with reference to FIG. 16. A module 108 includes a first wire group including a plurality of wires 5 disposed to extend across first component 41. In a plan view of module 108, the first wire group includes wires disposed in two or more directions. In the example shown in FIG. 16, the first wire group includes a group of wires extending in the vertical direction and a group of wires extending in the horizontal direction. The group of wires extending in the vertical direction intersects with the group of wires extending in the horizontal direction. In the example shown in FIG. 16, the angle of intersection between the group of wires extending in the vertical direction and the group of wires extending in the horizontal direction is 90°, which is however merely by way of example and may be any other angles. Other configurations are the same as those of module 101 described in the first embodiment.

In the present embodiment, more reliable shielding can be achieved.

Ninth Embodiment

A module in the ninth embodiment according to the present disclosure will be hereinafter described with reference to FIG. 17. A module 109 includes a first wire group including a plurality of wires 5 disposed to extend across a first component 41.

In a plan view of module 109, the first wire group includes a portion in which wires are sparsely arranged and a portion in which wires are densely arranged. In the example shown in FIG. 17, the distance between wires 5 decreases toward the upper right corner and the lower left corner of first component 41 in the figure. In the vicinity of the center of first component 41, the distance between wires 5 is relatively wide. Other configurations are the same as those of module 101 described in the first embodiment.

In the present embodiment, wires 5 belonging to the first wire group are arranged in a non-uniform manner to have a portion in which wires are sparsely arranged and a portion in which wires are densely arranged. Thus, a desired portion of first component 41 can be shielded in a focused manner.

Figure 17:
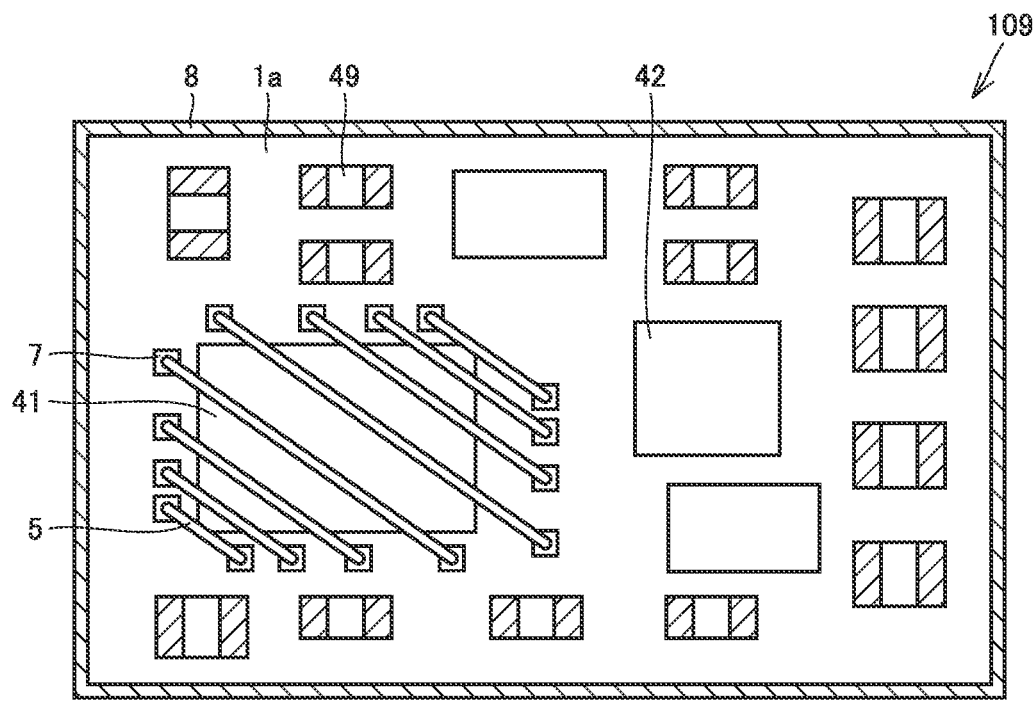
FIG. 17 is a perspective plan view of a module in a ninth embodiment according to the present disclosure.
Figure 18:
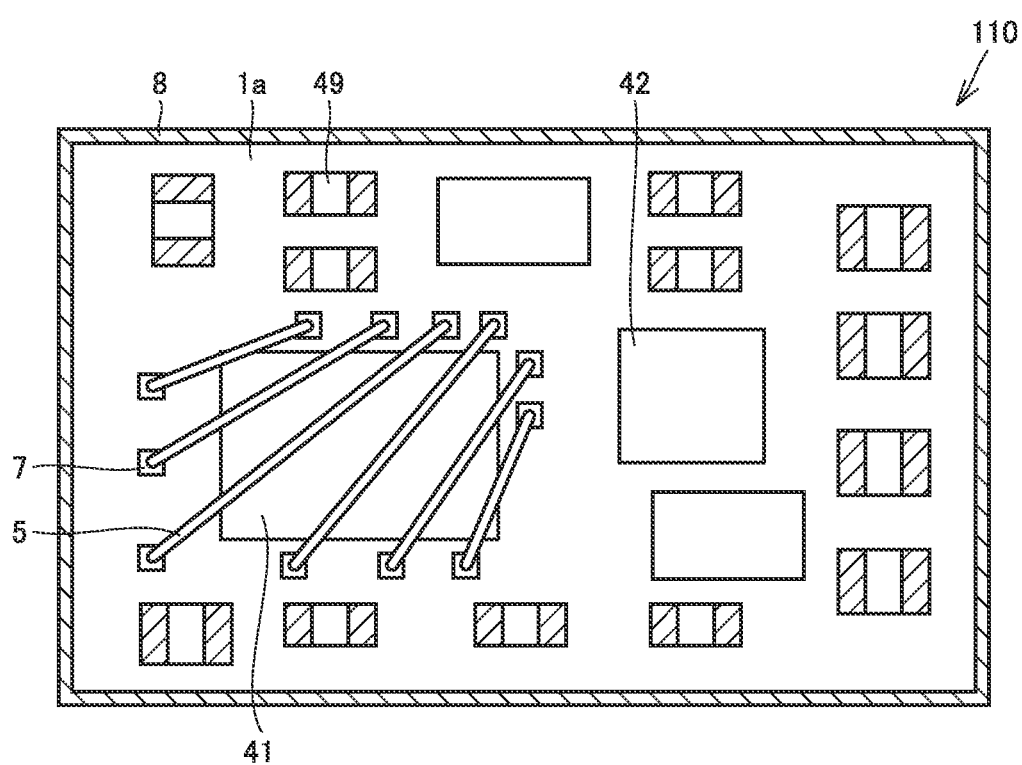
FIG. 18 is a perspective plan view of a modification of the module in the ninth embodiment according to the present disclosure.

In module 109 illustrated in FIG. 17, the plurality of wires 5 belonging to the first wire group are arranged in parallel, but such a parallel arrangement is not indispensable. For example, in a module 110 shown in FIG. 18, the plurality of wires 5 belonging to the first wire group are arranged in non-parallel to each other. In the vicinity of the upper right corner in the figure, wires 5 are densely arranged. By such a configuration, a desired portion of first component 41 can be shielded in a focused manner. Thus, the area to be shielded in a focused manner can be set more flexibly.

Tenth Embodiment

Figure 19:
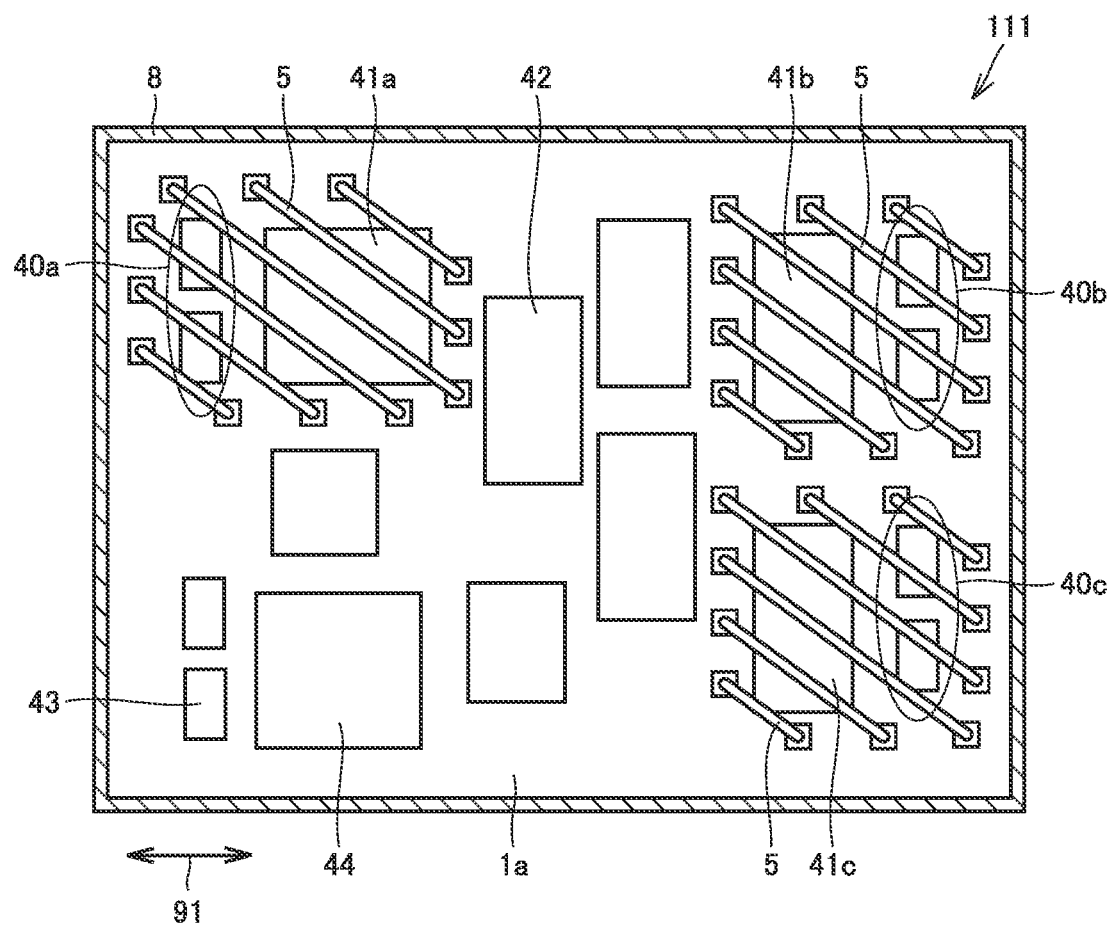
FIG. 19 is a perspective plan view of a module in a tenth embodiment according to the present disclosure.

A module in the tenth embodiment according to the present disclosure will be hereinafter described with reference to FIG. 19. In a module 111, components 41a, 41b, and 41c each as the first component are mounted on a first main surface 1a. Component 41a is a power amplifier (PA). Component 41b is a low noise amplifier (LNA). Component 41c is an antenna switch (ANT SW). In addition to these components, a number of electronic components are mounted on first main surface 1a. For example, components 42, 43, and 44 are mounted on first main surface 1a. A matching circuit 40a for a power amplifier is mounted in the vicinity of component 41a as a power amplifier. A matching circuit 40b for a low noise amplifier is mounted in the vicinity of component 41b as a low noise amplifier. A matching circuit 40c for an antenna switch is mounted in the vicinity of component 41c as an antenna switch. In this case, each of the matching circuits is shown as two small rectangular components by way of example, but the size, the shape, and the number of components as a matching circuit are not limited thereto.

A power amplifier and the like each are mounted as a transmission device while a low noise amplifier and the like each are mounted as a reception device. An antenna switch and the like each are mounted as a common device.

Module 111 includes a first wire group including a plurality of wires 5 disposed to extend across each of components 41a, 41b, and 41c as first components. In a plan view of module 111, the first wire group including wires 5 is disposed obliquely with respect to each of components 41a, 41b, and 41c. In extending across component 41a as the first component, the first wire group including the plurality of wires 5 is disposed to extend collectively across not only component 41a but also matching circuit 40a mounted in the vicinity of component 41a. In extending across component 41b as the first component, the first wire group including the plurality of wires 5 is disposed to extend collectively across not only component 41b but also matching circuit 40b mounted in the vicinity of component 41b. In extending across component 41c as the first component, the first wire group including the plurality of wires 5 is disposed to extend collectively across not only component 41c but also matching circuit 40c mounted in the vicinity of component 41c.

The isolation between devices deteriorates particularly due to magnetic flux coupling that is caused by an inductor as a matching circuit. Therefore, it is effective to surround the matching circuit with a shield in order to prevent deterioration of isolation. In the present embodiment, the devices and the matching circuits associated with the respective devices are collectively surrounded by a shield formed of a plurality of wires 5, so that deterioration of isolation can be prevented.

In the example shown in this case, the transmission device, the reception device, and the common device are divided into three groups that are surrounded for each group by respective shields each including a plurality of wires 5, but only some of these three groups of the transmission device, the reception device, and the common device may be surrounded by their respective shields each including a plurality of wires 5.

Figure 20:
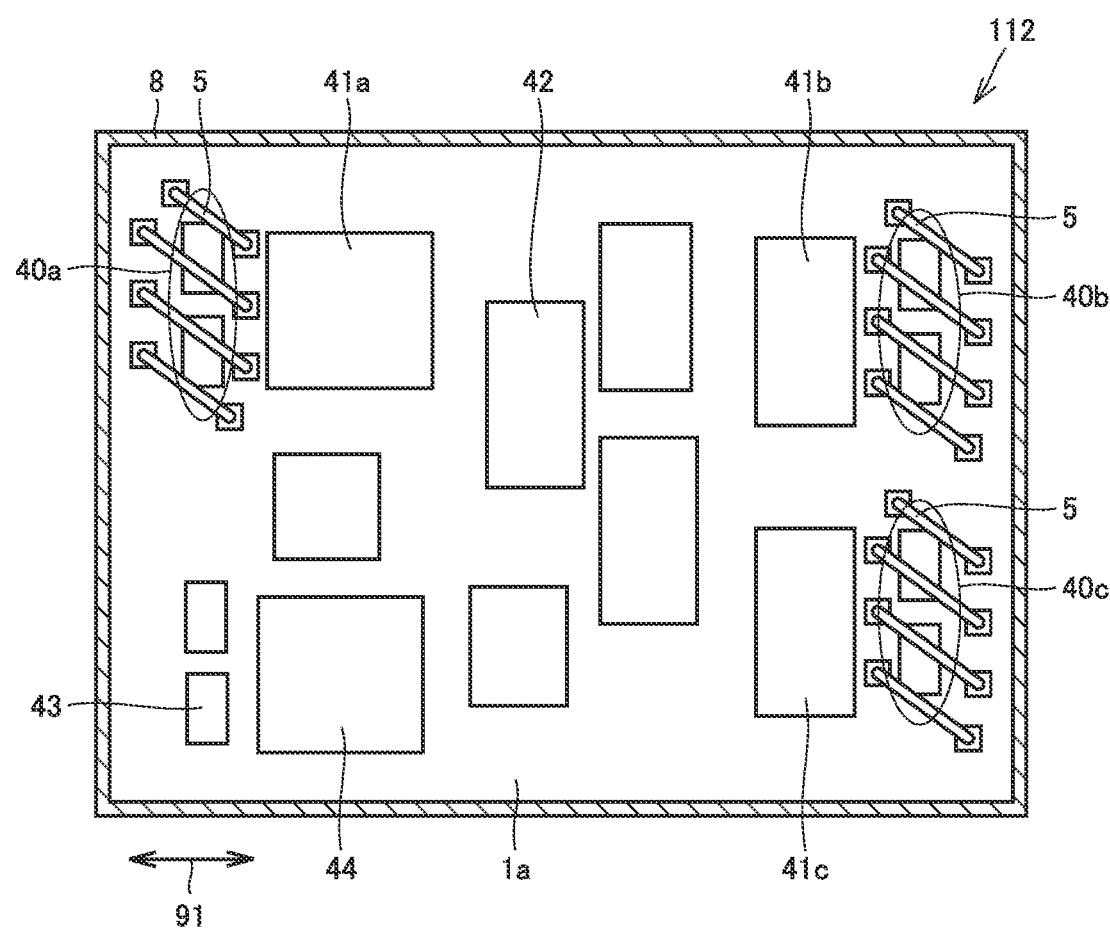
FIG. 20 is a perspective plan view of a modification of the module in the tenth embodiment according to the present disclosure.

FIG. 20 shows a modification of the module in the present embodiment. In a module 112 shown in FIG. 20, a plurality of wires 5 as the first wire group do not extend across each of components 41a, 41b, and 41c, but extend across only each of matching circuits 40a, 40b, and 40c. In other words, only matching circuits 40a, 40b, and 40c are surrounded by their respective shields. From the viewpoint of suppressing magnetic flux coupling caused by matching circuits, it is also meaningful to shield only each of matching circuits 40a, 40b, and 40c in this way. In the case of the present modification, the same feature as described above is applicable if matching circuits 40a, 40b, and 40c are regarded as the first components in place of components 41a, 41b, and 41c.

Among the above-described embodiments, one or more of the embodiments may be employed in an appropriate combination.

The above embodiments disclosed herein are illustrative and non-restrictive in every respect. The scope of the present disclosure is defined by the terms of the claims, and is intended to include any modifications within the meaning and scope equivalent to the terms of the claims.

1 board, 1a first main surface, 1b second main surface, 2 insulating layer, 5 wire, 6a first sealing resin, 6b second sealing resin, 7 pad electrode, 8 shield film, 11 external electrode, 12 conductor column, 13, 14, 15, 17 conductor via, 16 opening, 20 gap, 21 first ground conductor, 22 second ground conductor, 24, 26 ground conductor, 25 conductor, 40a, 40b, 40c matching circuit, 41 first component, 41a, 41b, 41c, 42, 43, 44, 47 component, 45, 46 second component, 49 chip component, 51 first end, 52 second end, 81 first conductor via group, 82 second conductor via group, 91 longitudinal direction, 101, 102, 103, 104, 105, 106, 107, 108, 109, 110, 111, 112 module.

The invention claimed is:
1. A module comprising:
a board having a first main surface;
a first component mounted on the first main surface;
a first wire group including a plurality of wires disposed to extend across the first component;
a first ground conductor disposed inside the board; and
a first conductor via group including a plurality of via conductors connecting each of the wires belonging to the first wire group and the first ground conductor, wherein the first ground conductor has a shape corresponding to a shape of the first component.

2. The module according to claim 1, further comprising one or more other ground conductors disposed inside the board, wherein the first ground conductor is independent of one or more other ground conductors.

3. The module according to claim 2, wherein the board has a second main surface opposite to the first main surface, and the module further comprises a second component mounted on the second main surface.

4. The module according to claim 2, wherein, in a plan view, the first wire group is disposed obliquely with respect to the first component.

5. The module according to claim 2, wherein, in a plan view, the first wire group includes a first portion and a second portion, the wires are more sparsely arranged in the first portion than in the second portion, and the wires are more densely arranged in the second portion than in the first portion.

6. The module according to claim 2, wherein the first component and the first wire group are sealed by a first sealing resin.

7. The module according to claim 1, wherein the board has a second main surface opposite to the first main surface, and the module further comprises a second component mounted on the second main surface.

8. The module according to claim 7, further comprising:
a second wire group including a plurality of wires disposed to extend across the second component;
a second ground conductor disposed inside the board; and
a second conductor via group including a plurality of via conductors connecting each of the wires belonging to the second wire group and the second ground conductor, wherein
the second component is surrounded by the second wire group, the second conductor via group, and the second ground conductor.

9. The module according to claim 8, wherein, in a plan view, the first wire group is disposed obliquely with respect to the first component.

10. The module according to claim 8, wherein, in a plan view, the first wire group includes a first portion and a second portion, the wires are more sparsely arranged in the first portion than in the second portion, and the wires are more densely arranged in the second portion than in the first portion.

11. The module according to claim 7, wherein, in a plan view, the first wire group is disposed obliquely with respect to the first component.

12. The module according to claim 7, wherein, in a plan view, the first wire group includes a first portion and a second portion, the wires are more sparsely arranged in the first portion than in the second portion, and the wires are more densely arranged in the second portion than in the first portion.

13. The module according to claim 7, wherein the first component and the first wire group are sealed by a first sealing resin.

14. The module according to claim 1, wherein, in a plan view, the first wire group is disposed obliquely with respect to the first component.

15. The module according to claim 14, wherein, in a plan view, the first wire group includes a first portion and a second portion, the wires are more sparsely arranged in the first portion than in the second portion, and the wires are more densely arranged in the second portion than in the first portion.

16. The module according to claim 1, wherein, in a plan view, the first wire group includes a first portion and a second portion, the wires are more sparsely arranged in the first portion than in the second portion, and the wires are more densely arranged in the second portion than in the first portion.

17. The module according to claim 1, wherein the first component and the first wire group are sealed by a first sealing resin.

18. The module according to claim 17, wherein an upper surface and a side surface of the first sealing resin and a side surface of the board are covered with a shield film.

19. The module according to claim 1, wherein the first ground conductor has an opening, a signal line is connected to the first component, and the signal line passes through the opening.

20. The module according to claim 1, wherein the first component is enclosed by the first wire group, the first conductor via group, and the first ground conductor.

* * * * *